(12) United States Patent
Taylor et al.

(10) Patent No.: US 8,043,944 B2
(45) Date of Patent: Oct. 25, 2011

(54) PROCESS FOR ENHANCING SOLUBILITY AND REACTION RATES IN SUPERCRITICAL FLUIDS

(75) Inventors: Theodore M. Taylor, Boise, ID (US); Stephen J. Kramer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/536,551

(22) Filed: Aug. 6, 2009

(65) Prior Publication Data

US 2009/0291545 A1 Nov. 26, 2009

Related U.S. Application Data

(62) Division of application No. 11/184,202, filed on Jul. 19, 2005, now Pat. No. 7,598,181.

(51) Int. Cl.
*H01L 21/20* (2006.01)
*H01L 21/3205* (2006.01)

(52) U.S. Cl. ........ 438/497; 438/597; 438/678; 438/680; 438/685; 438/686; 438/688; 257/E21.295

(58) Field of Classification Search .................. 438/597, 438/680, 497, 678, 685, 686, 688
See application file for complete search history.

(56) References Cited

U.S. PATENT DOCUMENTS

| | | | |
|---|---|---|---|
| 3,602,635 A | 8/1971 | Romanklw | |
| 5,789,027 A * | 8/1998 | Watkins et al. | 427/250 |
| 6,143,657 A | 11/2000 | Liu et al. | |
| 6,224,713 B1 | 5/2001 | Hembree et al. | |
| 6,261,953 B1 | 7/2001 | Uozumi | |
| 6,426,116 B1 | 7/2002 | Sunol | |
| 6,432,724 B1 | 8/2002 | Ahn et al. | |
| 6,537,916 B2 | 3/2003 | Mullee et al. | |
| 6,653,236 B2 | 11/2003 | Wai et al. | |
| 6,689,700 B1 | 2/2004 | Watkins et al. | |
| 6,715,498 B1 | 4/2004 | Humayun et al. | |
| 7,267,727 B2 | 9/2007 | McDermott et al. | |
| 2002/0022362 A1 | 2/2002 | Ahn et al. | |
| 2003/0012931 A1 | 1/2003 | Kuroda et al. | |
| 2003/0157248 A1 | 8/2003 | Watkins et al. | |
| 2003/0161954 A1 | 8/2003 | Blackburn et al. | |
| 2004/0266219 A1 | 12/2004 | Sarigiannis et al. | |
| 2005/0136292 A1 | 6/2005 | Mariani et al. | |
| 2005/0191861 A1 | 9/2005 | Verhaverbeke | |
| 2006/0065627 A1 | 3/2006 | Clarke et al. | |

FOREIGN PATENT DOCUMENTS

WO 01/32951 A2 5/2001

OTHER PUBLICATIONS

Brian S. Hoyle, et al., Ultrasound In The Process Industries, Engineering Science and Education Journal, Jun. 1994, pp. 119-122.
C. Horst, et al., Activated Solid-Fluid Reactions In Ultrasound Reactors, Chemical Engineering Science 54 (1999), pp. 2849-2858, Institut fur Chemische Verfahrenstechnik, Technische Universitiat Clausthal, LeibnizstraBe 17, D-38678 Clausthal-Zellerfeld, Germany.
Leigh Hagenson Thompson, et al., The Rate Enhancing Effect of Ultrasound by Inducing Supersaturation in A Solid-Liquid System, Chemical Engineering Science 55 (2000), pp. 3085-3090.
Porous Silicates Inspired By Nature: Fabrication and Processing, Materials Today, vol. 7, Issue 3, p. 18, Mar. 2004.
Brown, et al., Carbon Dioxide-Dilated Block Copolymer Templates for Nanostructured Materials, Materials Research Society Symposium Proceedings, vol. 584, pp. 169-174, Dec. 1999.
Watkins, et al., Supercritical Fluid Technology for Semiconductor Device Fabrication Deposition of Metals and Mesoporous Silicates from Carbon Dioxide, Presentation Abstract University of Arizona.
Wilson, Materials Made Under Pressure, Chemical & Engineering News: Science/Technology, vol. 78, No. 51, pp. 1-7, Dec. 18, 2000.

* cited by examiner

*Primary Examiner* — Alexander Ghyka
(74) *Attorney, Agent, or Firm* — Wells St. John P.S.

(57) ABSTRACT

Processes for enhancing solubility and the reaction rates in supercritical fluids are provided. In preferred embodiments, such processes provide for the uniform and precise deposition of metal-containing films on semiconductor substrates as well as the uniform and precise removal of materials from such substrates. In one embodiment, the process includes, providing a supercritical fluid containing at least one reactant, the supercritical fluid being maintained at above its critical point, exposing at least a portion of the surface of the semiconductor substrate to the supercritical fluid, applying acoustic energy, and reacting the at least one reactant to cause a change in at least a portion of the surface of the semiconductor substrate.

20 Claims, No Drawings

PROCESS FOR ENHANCING SOLUBILITY AND REACTION RATES IN SUPERCRITICAL FLUIDS

CROSS-REFERENCES TO RELATED APPLICATIONS

This application is a division of U.S. patent application Ser. No. 11/184,202 filed Jul. 19, 2005 entitled PROCESS FOR ENHANCING SOLUBILITY AND REACTION RATES IN SUPERCRITICAL FLUIDS.

BACKGROUND OF THE INVENTION

The invention relates to processes for enhancing solubility and reaction rates of in supercritical fluids, and more particularly to such processes as they relate to the fabrication of semiconductor devices.

As the demand for ever-smaller silicon devices continues, and as resolution continues below the sub-micron level, the need for uniform and precise processes for depositing conductive pathways and interconnects is increasing. It is also desirable for such processes to proceed rapidly. For example, it is frequently desired to form metal-containing materials in and over semiconductor substrates. The metal-containing materials can be incorporated into integrated circuit devices, and/or can be utilized for formation of conductive interconnects between integrated circuit devices. There is also a need to provide substantially clean and defect free semiconductor substrates and surfaces onto which other materials may be deposited. Processes for uniformly and precisely etching and/or cleaning such substrates are needed.

Wai et al, U.S. Pat. No. 6,653,236, describe methods of forming metal containing films over surfaces of semiconductor substrates using a supercritical fluid that contains metal forming precursors dispersed therein. A supercritical fluid is a composition that exists in a quasi-liquid state above a defined critical pressure and a critical temperature for the composition. For example, carbon dioxide becomes a supercritical fluid at temperatures above 31° C. and pressures above 1073 psi (73 atmospheres). Typical working conditions for supercritical $CO_2$ are in the range of from about 60-100° C. and 1500-4500 psi. The use of supercritical fluids permits much greater amounts of precursors and/or reactants to be dissolved or dispersed than prior CVD (chemical vapor deposition) processes. However, reaction rates have been slower than predicted.

Others have used ultrasound in attempts to enhance reaction rates on semiconductor substrates. For example, Hembree et al, U.S. Pat. No. 6,224,713, describe a method and apparatus that uses ultrasonic waves to wet etch silicon substrates to provide defect-free silicon structures. But, these methods have applied ultrasonic energy to traditional reactions carried out in conventional liquids. It is well known that the application of ultrasonic energy to conventional liquids causes cavitation and/or microbubble formation. It is these mechanisms that enhance mixing of reactants to increase reaction rates. However, cavitation and microbubble formation are not possible using supercritical fluids. By definition, cavitation and gas bubble formation cannot occur in a fluid maintained at or above its critical point.

Accordingly, the need still exists to enhance reaction rates in supercritical fluids and to enhance reaction rates on or in semiconductor substrates. The need also exists for processes that produce uniform and precise results in the deposition or removal of materials from the surfaces of semiconductor substrates.

SUMMARY OF THE INVENTION

The present invention meets these needs by providing processes for enhancing solubility and reaction rates in supercritical fluids, and more particularly to such processes as they relate to the uniform and precise deposition of metal-containing films on semiconductor substrates as well as the uniform and precise removal of materials from such substrates. The processes may involve chemical reactions or may simply enhance the solubility of materials on the surfaces of such substrates.

In accordance with one aspect of the present invention, a process for enhancing the rate of a reaction at the surface of a semiconductor substrate is provided and comprises, providing a supercritical fluid containing at least one reactant, the supercritical fluid being maintained at above its critical point, exposing at least a portion of the surface of the semiconductor substrate to the supercritical fluid, applying acoustic energy, and reacting the at least one reactant to cause a change in at least a portion of the surface of the semiconductor substrate. The acoustic energy may be applied directly to the supercritical fluid, or may be applied to the semiconductor substrate (and thus indirectly to the supercritical fluid) through a suitable equipped wafer chucking or holding device. The applied acoustic energy is coupled through the semiconductor substrate to the supercritical fluid. The reactant may comprise a chemical precursor such as an organometallic compound. Alternatively, the reactant may comprise an etchant composition.

Preferably, the acoustic energy comprises ultrasonic energy. The ultrasonic energy may be supplied directly to the supercritical fluid from a probe located in or adjacent to the fluid or indirectly by coupling an ultrasonic energy source to the semiconductor substrate. Preferably lower frequency ultrasonic energy is used and has a frequency of between about 20 to about 100 kilohertz. The supercritical fluid may be selected from the group consisting of carbon dioxide, ammonia, $C_1$ through $C_5$ alcohols, $C_2$ through $C_8$ hydrocarbons, water, xenon, nitrous oxide, tetrafluoromethane, difluoromethane, tetrafluoroethane, pentafluoroethane, sulfur hexafluoride, CFC-12, HCFC-22, HCFC-123, HFC-116, HFC-134a, dimethylether, and mixtures thereof.

In accordance with one embodiment of the invention, the change in the semiconductor substrate comprises the deposition of a layer of material onto at least a portion of the surface of the semiconductor substrate. In this embodiment, the at least one reactant comprises a metal-containing composition such as, for example, an organometallic precursor. The metal-containing composition may comprise one or more of Al, Au, Ba, Co, Cr, Ga, Hf, In, Ir, Mo, Ni, Pt, Pd, Re, Rh, Ru, Sn, Sr, Ta, Ti, Tl, W, and Zr, including organic metal-containing precursors, or one or more semiconducting metals or materials such as B, Si, Ge, As, Sb, Te, Se, and their organic-containing precursors. Other agents such as catalysts may also be present.

In accordance with another embodiment of the invention, the change in the semiconductor substrate comprises etching at least a portion of the surface of the semiconductor substrate. In this embodiment, the at least one reactant comprises an etchant composition. The etchant composition may be selected from the group consisting of acidic etchants and alkaline etchants. Other agents such as surfactants and wetting agents may also be present.

In accordance with yet another embodiment of the invention, a method for enhancing the dissolution of a solute in a supercritical fluid is provided and comprises providing a supercritical fluid maintained at above its critical point, introducing a solute composition to the supercritical fluid, and applying acoustic energy to the supercritical fluid. In a preferred form, the process includes exposing the supercritical fluid containing the solute to at least a portion of a semiconductor substrate, and reacting the solute to cause a change in at least a portion of the surface of the semiconductor substrate. The acoustic energy preferably comprises ultrasonic energy that may be supplied to the supercritical fluid from a probe located in or adjacent to the fluid or by coupling an ultrasonic energy source to the semiconductor substrate. Preferably, the ultrasonic energy is has a frequency of between about 20 to about 100 kilohertz. As with previous embodiments, the supercritical fluid may be selected from the group consisting of carbon dioxide, ammonia, $C_1$ through $C_5$ alcohols, $C_2$ through $C_8$ hydrocarbons, water, xenon, nitrous oxide, tetrafluoromethane, difluoromethane, tetrafluoroethane, pentafluoroethane, sulfur hexafluoride, CFC-12, HCFC-22, HCFC-123, HFC-116, HFC-134a, dimethylether, and mixtures thereof. For example, the supercritical fluid may comprise carbon dioxide and the solutes may comprise water and tetraethylorthosilicate.

Another embodiment of the invention provides a method for enhancing the solubility of a solid on the surface of a semiconductor substrate. The solid may be in the form of a film, a residue, a coating, or particles. The method includes providing a supercritical fluid maintained at above its critical point in contact with the solid semiconductor substrate and exposing at least a portion of the semiconductor substrate having the solid thereon to the supercritical fluid, applying acoustic energy, solubilizing at least a portion of the solid on the surface of the semiconductor substrate, and removing the solubilized solid. The solid can be from a number of different sources including photoresists, etch residues, etch-produced polymers, metal contaminants, and sacrificial films.

Accordingly, it is a feature of the present invention to provide processes for enhancing the solubility of reactants and the reaction rates of solutes in supercritical fluids. It is a further feature of the invention to provide processes that may be used to obtain uniform and precise deposition of metal-containing films on semiconductor substrates as well as the uniform and precise removal of materials from such substrates. These and other features and advantages of the invention will become apparent from the following detailed description and accompanying claims.

DETAILED DESCRIPTION OF THE PREFERRED EMBODIMENTS

When working with liquids that are used in metal deposition or metal removal processes, acoustic (ultrasonic) energy can be applied to the liquid to induce cavitation and microbubble formation, phenomena that can enhance reaction rates. However, when operating in fluids at above their critical temperature and pressure points, there can be no gas formation, and thus there is no cavitation or microbubble formation. Further, when operating at the critical point of a fluid, there is no sound propagation. That is, there is total attenuation of applied acoustic energy to the liquid.

We have found that one can operate above the critical point of a fluid where sound propagation again occurs. For example, when operating in supercritical $CO_2$ at 31° C., a graph of sound velocity (in meters/sec) versus pressure (in pounds per square inch) will show a drop in sound velocity through the fluid as the pressure approaches 1073 psi (the critical point) until the sound velocity approaches zero at the critical point. However, as pressure increases above 1073 psi, sound velocity will again increase. By operating at above the critical point in a fluid, one can achieve sound propagation that is comparable to sound propagation in conventional fluids.

We have determined that acoustic energy can be used to enhance both solubility and reaction rates in supercritical fluids. While not wishing to be bound by any particular theory, it is believed that pressure swings in the fluid are created by the leading and trailing edges of the acoustic waves as they propagate through the supercritical fluid medium. Such pressure swings overcome boundary layer effects at the surface where reaction is desired. Specifically, the leading edge of a propagated wave creates a temporary increase in pressure which increases solubility of the selected solute in the fluid medium. Likewise, the trailing edge of the propagated wave creates a temporary pressure drop which results in the reduced solubility of a reaction product at a surface of interest. Such reduced solubility may result in the precipitation of the reaction product. Thus, the application of acoustic energy to a supercritical fluid maintained at above its critical point enhances bulk solubility of reactants in the fluid while also enhancing transfer, including precipitation, of reactants out of solution at a surface of interest.

Because the attenuation coefficient for ultrasound increases with frequency, it is preferred that any process be conducted at above the critical point of the fluid, but using lower frequency ultrasonic energy. A preferred frequency range for applied acoustic energy is from about 10 to about 10,000 KHz. Operation at higher frequencies is possible, but attenuation becomes greater so there is less propagation of the acoustic energy through the fluid.

Depending on the desired process, acoustic energy may be provided in a number of ways. For example, to enhance solubilization of reactants in a bulk fluid, one or more conventional ultrasonic probes may be positioned in or adjacent to a sono-reactor to couple them to the fluid. Where it is desired to enhance a reaction at a surface of a substrate, the probe or probes may be positioned adjacent the surface. Generally, the probe should be positioned within a few centimeters (from about 1 to about 10 cm) of where the desired effect is to occur, either bulk dissolution or deposition. Alternatively, acoustic energy may be imparted to a surface by coupling an ultrasonic transducer to the back side of a substrate. For example, the transducer may be in the form of a piezoelectric plate or block which is coupled to a substrate to cause the substrate to vibrate. Reactions at the opposite surface of the substrate are enhanced in this manner.

In one embodiment, the process of the present invention may be used to enhance dissolution of chemical precursors for supercritical fluid deposition (SCFD) of metals, oxides, and nitrides. SCFD is a technique for depositing thin films onto semiconductor substrates. The process involves dissolving a precursor, for example tetra-orthoethylsilicate (TEOS) and a reactant, for example water, into a supercritical solvent fluid such as carbon dioxide. The supercritical fluid containing the dissolved precursor and reactant is fed to a reaction chamber containing a heated semiconductor substrate where the precursor and reactant react to form a thin film of silicon oxide. By controlling the temperature and pressure at which the precursor and reactant are mixed, the precursor and reactant can be dissolved into the supercritical fluid at below the temperature at which a reaction occurs. Then, when the supercritical fluid with dissolved reactants encounters the heated substrate, the reaction occurs causing a thin film of silicon oxide to deposit.

By applying relatively low frequency (10 to 10,000 KHz) acoustic energy to the supercritical fluid, the solubility of water is enhanced. Solubility in supercritical fluids is generally a strong function of fluid pressure. The application of acoustic energy locally modulates the pressure in the fluid (which acts as a solvent) to provide increased solubility. The high mass transfer rate found in supercritical fluids also allows the dissolved precursor and reactant to rapidly diffuse away from a source and into the bulk fluid. The acoustic energy also acts to overcome boundary layer effects at the surfaces of precursor and reactant sources to enhance the dissolution rate.

The process of the present invention may be utilized to solubilize precursors and reactants for the deposition of metals, oxides, nitrides, carbides, silicides, semiconductors, and other compounds, for enhancing surface cleaning operations, and for enhancing reactions that take place either in the bulk fluid or at a substrate surface. The process may also be used to enhance the solubilization of organometallics, metal-containing compounds, semiconductor metal-containing compounds such as, for example, TEOS, chelated metals, water, metal alkoxides, surfactants, monomers, and oligomers prior to reaction in the supercritical fluid.

In a preferred embodiment, the process may be used to deposit metal films onto semiconductor substrates such as those films taught by Wai et al, U.S. Pat. No. 6,653,236, the entire disclosure of which is incorporated herein. The metal-containing films can comprise, for example, one or more of Al, Au, Ba, Co, Cr, Cu, Ga, Hf, In, Ir, Mo, Ni, Re, Rh, Ru, Sn, Sr, Ta, Ti, Tl, W and Zr. Alternatively, or in addition, the films can comprise semiconducting metals or compounds that include B, Si, Ge, As, Sb, Te, and Se.

In this embodiment, the process includes exposing a surface of the semiconductor substrate to a supercritical fluid. In the supercritical region there is only one phase, and it possesses properties of both gas and liquid. Supercritical fluids differ from traditional liquids in several aspects. For example, the solvent power of a supercritical fluid will typically increase with density at a given temperature. The utilization of supercritical fluid can reduce a temperature at which metals are deposited relative to other methods, and yet can enhance a deposition rate of the metals. Additionally, deposition from within a supercritical fluid can allow for infiltration of very small, high aspect ratio features. Thus, the process can be used to fill sub-micron nano-features.

The supercritical fluid may comprise one or more of $CO_2$, ammonia, or an alkanol having from one to five carbon atoms. Exemplary alkanols are ethanol and methanol. Other exemplary materials that can be formed into supercritical fluids are isooctane, hexane, heptane, butane, methane, ethane, propane, ethene, propene, water, xenon, nitrous oxide, tetrafluoromethane, difluoromethane, tetrafluoroethane, pentafluoroethane, sulfur hexafluoride, CFC-12, HCFC-22, HCFC-123, HFC-116, HFC-134a, and dimethylether.

For particular applications the supercritical fluid can comprise $CO_2$, and can include various components, including, for example, a catalyst such as an $H_2$-activating catalyst dissolved therein. An advantage of utilizing $CO_2$, as opposed to other supercritical fluids, is that $CO_2$ has a relatively low critical temperature of 31° C. The metal-containing precursor utilized in particular aspects of the present invention comprises a metal (such as, for example, Al, Au, Co, Cr, Cu, Hf, In, Ir, Mo, Ni, Rh, Ru, Sn, Ta, Ti, W and/or Zr) in combination with a chemical group (which can be referred to as a ligand) which enhances solubility of the metal in the supercritical fluid. Suitable ligands include β-diketones of the general formula $R_1$ $C(O)CH_2$ $C(O)R_2$, in which $R_1$ and $R_2$ can be fluorinated or non-fluorinated alkyl groups. Exemplary β-diketones are acetylacetone, trifluoroacetylacetone, hexafluoroacetylacetone, thenoyltrifluoroacetone, and heptafluorobutanoylpivaroylmethane. Other suitable ligands include 6,6,7,7,8,8,8-heptafluoro-2,2-dimethyl-3,5-octadionate and tris(2,2,6,6-tetramethyl-3,5-heptanedionate.

For applications in which the supercritical fluid comprises $CO_2$, the chemical group utilized to enhance solubility of a metal within the fluid can comprise a fluorocarbon, with an exemplary group being hexafluoroacetylacetone. An exemplary copper-containing precursor is copper(II) hexafluoroacetylacetonate ($Cu(hfa)_2$). Additionally, or alternatively, the metal-containing precursor can comprise one or more of cobalt(II) hexafluoroacetylacetonate, nickel(II) hexafluoroacetylacetonate, and gold(II) hexafluoroacetylacetonate.

The $H_2$-activating catalyst is a material which can react with $H_2$ to form at least one activated hydrogen species. The catalyst can include, for example, noble metal catalysts, and can, in particular applications, include at least one of palladium, platinum, rhodium, iridium and ruthenium. In particular applications, the catalyst can comprise one or more of palladium, platinum, titanium; tin and ruthenium. For example, a single catalyst can be provided, and such catalyst can be palladium.

While certain representative embodiments and details have been shown for the purpose of illustrating the invention, it will be apparent to those skilled in the art that various changes in the methods and apparatus disclosed herein may be made without departing from the scope of the invention, which is defined in the appended claims.

What is claimed is:

1. A method for enhancing the rate of deposition at the surface of a semiconductor substrate comprising, providing a supercritical fluid containing at least one reactant, said supercritical fluid being maintained at above its critical point, exposing at least a portion of said surface of said semiconductor substrate to said supercritical fluid, applying acoustic energy by coupling an energy source directly to said semiconductor substrate, and reacting said at least one reactant to deposit a layer of material onto at least a portion of the surface of said semiconductor substrate.

2. A method as claimed in claim 1 in which said at least one reactant comprises a metal-containing composition.

3. A method for enhancing the rate of deposition at the surface of a semiconductor substrate comprising, providing a supercritical fluid containing at least one reactant comprising a metal-containing composition comprising one or more of Al, Au, Ba, Co, Cr, Ga, In, Ir, Mo, Ni, Pt, Pd, Re, Rh, Ru, Sn, Sr, Tl, W, and Zr; said supercritical fluid being maintained at above its critical point, exposing at least a portion of said surface of said semiconductor substrate to said supercritical fluid, applying acoustic energy by coupling an energy source directly to said semiconductor substrate, and reacting said at least one reactant to deposit a layer of material onto at least a portion of the surface of said semiconductor substrate.

4. A method as claimed in claim 1 in which said reactant comprises a semiconductor metal-containing composition.

5. A method for enhancing the rate of deposition at the surface of a semiconductor substrate comprising, providing a supercritical fluid comprising at least one reactant comprising a semiconductor metal-containing composition comprising one or more of B, Ge, As, Sb, Te, and Se; said supercritical fluid being maintained at above its critical point, exposing at least a portion of said surface of said semiconductor substrate to said supercritical fluid, applying acoustic energy by coupling an energy source directly to said semiconductor substrate, and reacting said at least one reactant to deposit a layer of material onto at least a portion of the surface of said semiconductor substrate.

6. A method for enhancing the rate of deposition of a metal-containing film at the surface of a semiconductor substrate comprising, providing a supercritical fluid containing at least one metal-containing or semiconductor metal-containing reactant, said supercritical fluid being maintained at above its critical point, exposing at least a portion of said surface of said semiconductor substrate to said supercritical fluid, applying acoustic energy to said supercritical fluid by coupling an ultrasonic energy source directly to said semiconductor substrate, and reacting said at least one metal-containing or semiconductor metal-containing reactant to cause a metal-containing or semiconductor metal-containing film to be deposited onto at least a portion of said surface of said semiconductor substrate.

7. A method as claimed in claim 6 in which said acoustic energy comprises ultrasonic energy.

8. A method as claimed in claim 7 in which said ultrasonic energy is supplied to said supercritical fluid from a probe located in said fluid.

9. A method as claimed in claim 7 in which said ultrasonic energy is has a frequency of between about 20 to about 100 kilohertz.

10. A method as claimed in claim 6 in which said supercritical fluid is selected from the group consisting of carbon dioxide, ammonia, C1 through C5 alcohols, C2 through C8 hydrocarbons, water, xenon, nitrous oxide, tetrafluoromethane, difluoromethane, tetrafluoroethane, pentafluoroethane, sulfur hexafluoride, CFC-12, HCFC-22, HCFC-123, HFC-116, HFC-134a, dimethylether, and mixtures thereof.

11. A method as claimed in claim 6 in which said metal-containing reactant comprises one or more of Al, Au, Ba, Co, Cr, Ga, In, Ir, Mo, Ni, Pt, Pd, Re, Rh, Ru, Sn, Sr, Tl, W, and Zr.

12. A method as claimed in claim 6 in which said semiconductor metal-containing reactant comprises one or more of B, Ge, As, Sb, Te, and Se.

13. A method for enhancing the rate of deposition at the surface of a semiconductor substrate comprising, providing a supercritical fluid containing at least one reactant, said supercritical fluid being maintained at above its critical point, exposing at least a portion of said surface of said semiconductor substrate to said supercritical fluid, applying acoustic energy, said acoustic energy comprising ultrasonic energy which is supplied to said supercritical fluid by coupling an ultrasonic source directly to said semiconductor substrate; and reacting said at least one reactant to deposit a layer of material onto at least a portion of the surface of said semiconductor substrate.

14. A method as claimed in claim 2 in which said metal-containing composition comprises one or more of Hf, Ta, and Ti.

15. A method as claimed in claim 4 in which said semiconductor metal-containing composition comprises Si.

16. A method for enhancing the rate of deposition of a metal-containing film at the surface of a semiconductor substrate comprising, providing a supercritical fluid containing at least one metal-containing or semiconductor metal-containing reactant, said supercritical fluid being maintained at above its critical point, exposing at least a portion of said surface of said semiconductor substrate to said supercritical fluid, applying acoustic energy to said supercritical fluid by coupling an energy source directly to said semiconductor substrate, and reacting said at least one metal-containing or semiconductor metal-containing reactant to cause a metal-containing or semiconductor metal-containing film to be deposited onto at least a portion of said surface of said semiconductor substrate.

17. A method as claimed in claim 6 in which said metal-containing composition comprises one or more of Hf, Ta, and Ti.

18. A method as claimed in claim 6 in which said semiconductor metal-containing composition comprises Si.

19. A method as claimed in claim 2 in which said metal-containing composition comprises one or more of Al, Au, Co, Cr, In, Ir, Mo, Ni, Pt, Pd, Rh, Ru, Sn, W, and Zr.

20. A method as claimed in claim 4 in which said semiconductor metal-containing composition comprises one or more of B, Ge, As, Sb, Te, and Se.

* * * * *

UNITED STATES PATENT AND TRADEMARK OFFICE
CERTIFICATE OF CORRECTION

PATENT NO.        : 8,043,944 B2
APPLICATION NO.   : 12/536551
DATED             : October 25, 2011
INVENTOR(S)       : Theodore M. Taylor et al.

It is certified that error appears in the above-identified patent and that said Letters Patent is hereby corrected as shown below:

In column 7, line 26, in Claim 9, after "energy" delete "is".

Signed and Sealed this
Thirteenth Day of December, 2011

David J. Kappos
*Director of the United States Patent and Trademark Office*